United States Patent
Foelsche

(10) Patent No.: US 12,001,771 B2
(45) Date of Patent: Jun. 4, 2024

(54) VARIANT MODEL-BASED COMPILATION FOR ANALOG SIMULATION

(71) Applicant: Siemens Industry Software Inc., Plano, TX (US)

(72) Inventor: Peter Foelsche, Austin, TX (US)

(73) Assignee: Siemens Industry Software Inc., Plano, TX (US)

( * ) Notice: Subject to any disclaimer, the term of this patent is extended or adjusted under 35 U.S.C. 154(b) by 343 days.

(21) Appl. No.: 17/412,404

(22) Filed: Aug. 26, 2021

(65) Prior Publication Data

US 2023/0069588 A1 Mar. 2, 2023

(51) Int. Cl.
*G06F 30/30* (2020.01)
*G06F 30/323* (2020.01)
*G06F 30/367* (2020.01)

(52) U.S. Cl.
CPC .......... *G06F 30/367* (2020.01); *G06F 30/323* (2020.01)

(58) Field of Classification Search
CPC ..... G06F 30/367; G06F 30/323; G06F 30/373
See application file for complete search history.

(56) References Cited

U.S. PATENT DOCUMENTS

| 2019/0211475 A1* | 7/2019 | Ito | C12N 5/0606 |
| 2020/0356639 A1* | 11/2020 | Liao | G06F 30/3323 |
| 2022/0405457 A1* | 12/2022 | Chung | G06F 30/327 |

* cited by examiner

*Primary Examiner* — Jack Chiang
*Assistant Examiner* — Brandon Bowers

(57) ABSTRACT

A computing system implementing a design verification system can detect multiple analog design blocks in a circuit design describing an electronic device. The design verification system can generate equivalent networks for the analog design blocks using different sets of the parameters of the analog design blocks by selectively collapsing nodes and branches in the analog design blocks based on values of the different sets of the parameters. The equivalent networks can correspond to behavioral topologies of the analog design blocks having the different sets of the parameters. The design verification system can selectively compile a subset of the analog design blocks into multiple compiled variant models based on a comparison of the equivalent networks. The design verification system can include an analog simulator to simulate the analog design blocks in the circuit design using the compiled variant models.

17 Claims, 4 Drawing Sheets

VARIANT MODEL-BASED COMPILATION FOR ANALOG SIMULATION

TECHNICAL FIELD

This application is generally related to electronic design automation and, more specifically, to variant model-based compilation for analog simulation.

BACKGROUND

Designing and fabricating electronic systems typically involves many steps, known as a "design flow." The particular steps of a design flow often are dependent upon the type of electronic system to be manufactured, its complexity, the design team, and the fabricator or foundry that will manufacture the electronic system from a design. Initially, a specification for a new electronic system can be transformed into a logical design, for example, describing the electronic system in terms of both the exchange of signals between circuit components and the operations that can be performed on those signals. Logical designs that describe analog circuitry are typically written in one or more Hardware Design Languages (HDLs), such as Simulation Program with Integrated Circuit Emphasis (SPICE), Eldo-SPICE, Spectre, Verilog Analog (Verilog-A), or the like.

After the logical design has been generated, verification tools can be utilized to verify a functionality of the logical design, for example, by running simulators and/or hardware emulators, or by utilizing formal techniques, allowing any errors in the design discovered during the verification process to be corrected. Simulators of analog circuit designs, often called analog simulators or SPICE simulators, can simulate the analog circuitry described in the analog circuit designs, for example, using a continuous time matrix-based differential equation solver, where the analog simulator maps device terminals and connectivity into a matrix structure and iteratively determines sets of voltages and currents for all nodes and branches in the analog circuit design. In each iteration, the analog simulator can stamp the matrix with the current and voltage characteristics for each device in the analog circuit design, and can utilize those current and voltage characteristics to solve for Kirchoff's current law and Kirchoff's voltage law using Linear Algebra techniques, which generates the set of voltages and currents for all nodes and branches in the analog circuit design at each iteration.

Many analog simulators include a library of built-in circuit models, for example, written in C code, which can correspond to analog circuitry in the logical designs. These built-in models can be highly optimized, for example, eliminating extraneous calculations and/or nodes in the matrix structure, which can allow the analog simulators to operate quickly. Many logical designs, however, also include analog devices not having a corresponding built-in model that designers typically model at a higher-level of abstraction, for example, in a Verilog-A hardware description language. While the higher-level of abstraction of Verilog-A offers designers increased modeling flexibility, it often comes with the tradeoff of reduced simulator performance due to the lack of similar model optimization provided by the built-in models.

SUMMARY

This application discloses a computing system implementing a design verification system to identify multiple analog design blocks in a circuit design describing an electronic device. The design verification system can generate equivalent networks for the analog design blocks using different sets of the parameters of the analog design blocks by selectively collapsing nodes and branches in the analog design blocks based on values of the different sets of the parameters. The equivalent networks can correspond to behavioral topologies of the analog design blocks having the different sets of the parameters. The design verification system can selectively compile a subset of the analog design blocks into multiple compiled variant models based on a comparison of the equivalent networks. In some embodiments, the computing system can generate an intermediate function for the analog design blocks that, when called, generates equivalent networks for the analog design blocks using the different sets of the parameters, compares the equivalent networks, and selectively triggers compilation of the analog design blocks based, at least in part, on the comparison. The design verification system can include an analog simulator to simulate the analog design blocks in the circuit design using the compiled variant models. Embodiments of will be described below in greater detail.

DETAILED DESCRIPTION

Illustrative Operating Environment

Figure 1:
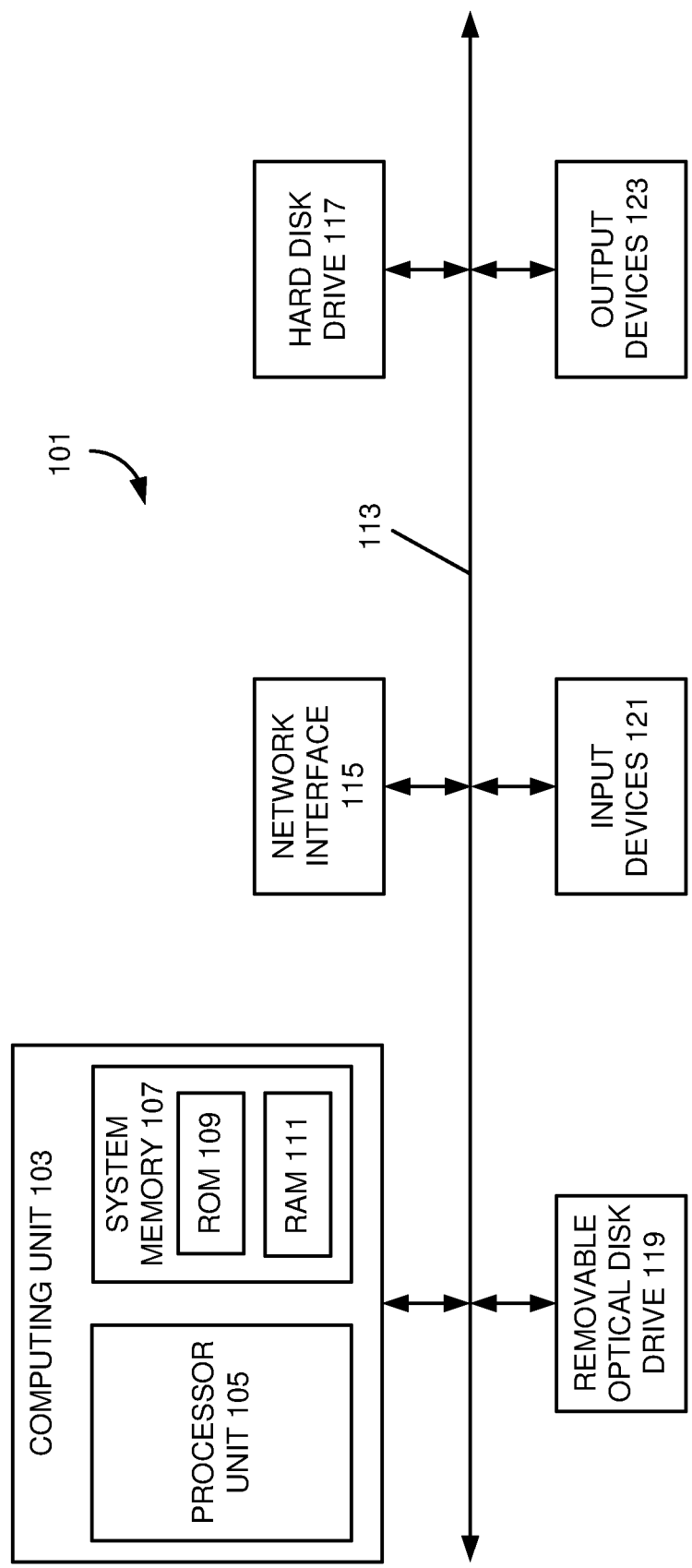
FIGS. 1 and 2 illustrate an example of a computer system of the type that may be used to implement various embodiments.

Various examples may be implemented through the execution of software instructions by a computing device 101, such as a programmable computer. Accordingly, FIG. 1 shows an illustrative example of a computing device 101. As seen in this figure, the computing device 101 includes a computing unit 103 with a processor unit 105 and a system memory 107. The processor unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processor unit 105.

The processor unit 105 and the system memory 107 are connected, either directly or indirectly, through a bus 113 or alternate communication structure, to one or more peripheral devices 115-123. For example, the processor unit 105 or the system memory 107 may be directly or indirectly connected to one or more additional memory storage devices, such as a hard disk drive 117, which can be magnetic and/or removable, a removable optical disk drive 119, and/or a flash memory card. The processor unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 115-123 may be internally housed with the computing unit 103. Alternately, one or more of the peripheral devices 115-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
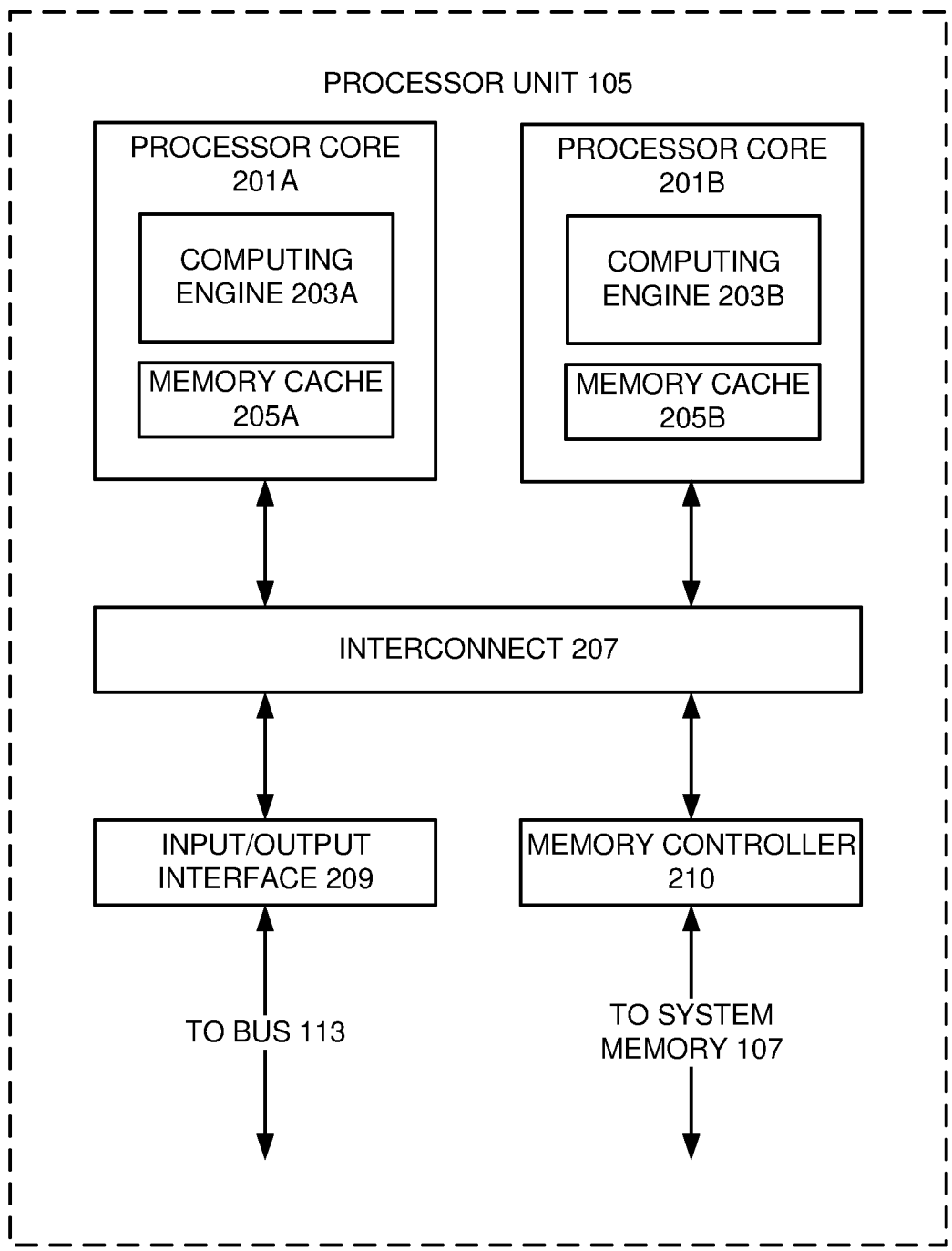

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, California, the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and is not intended to suggest any limitation as to the scope of use or functionality of alternate embodiments.

Variant Model-Based Compilation for Analog Simulation

Figure 3:
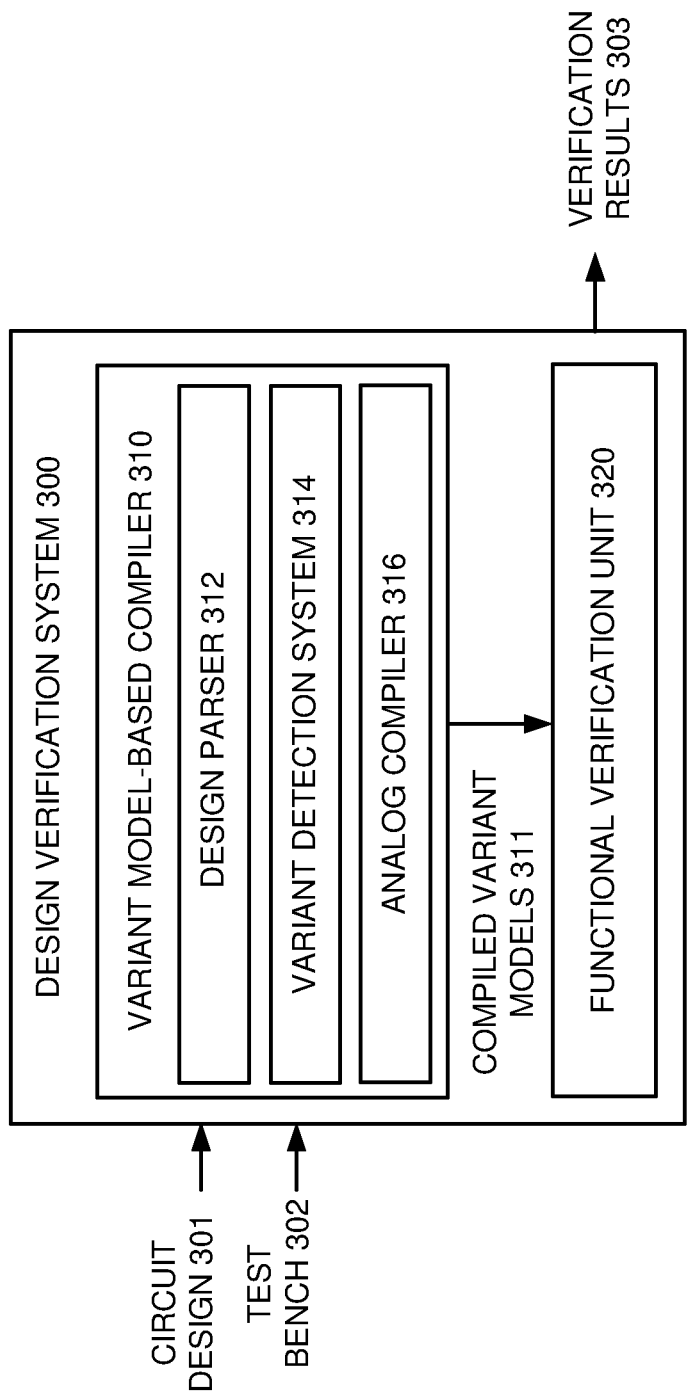
FIG. 3 illustrates an example design verification system for having a variant model-based compiler for analog simulation that may be implemented according to various embodiments.
Figure 4:
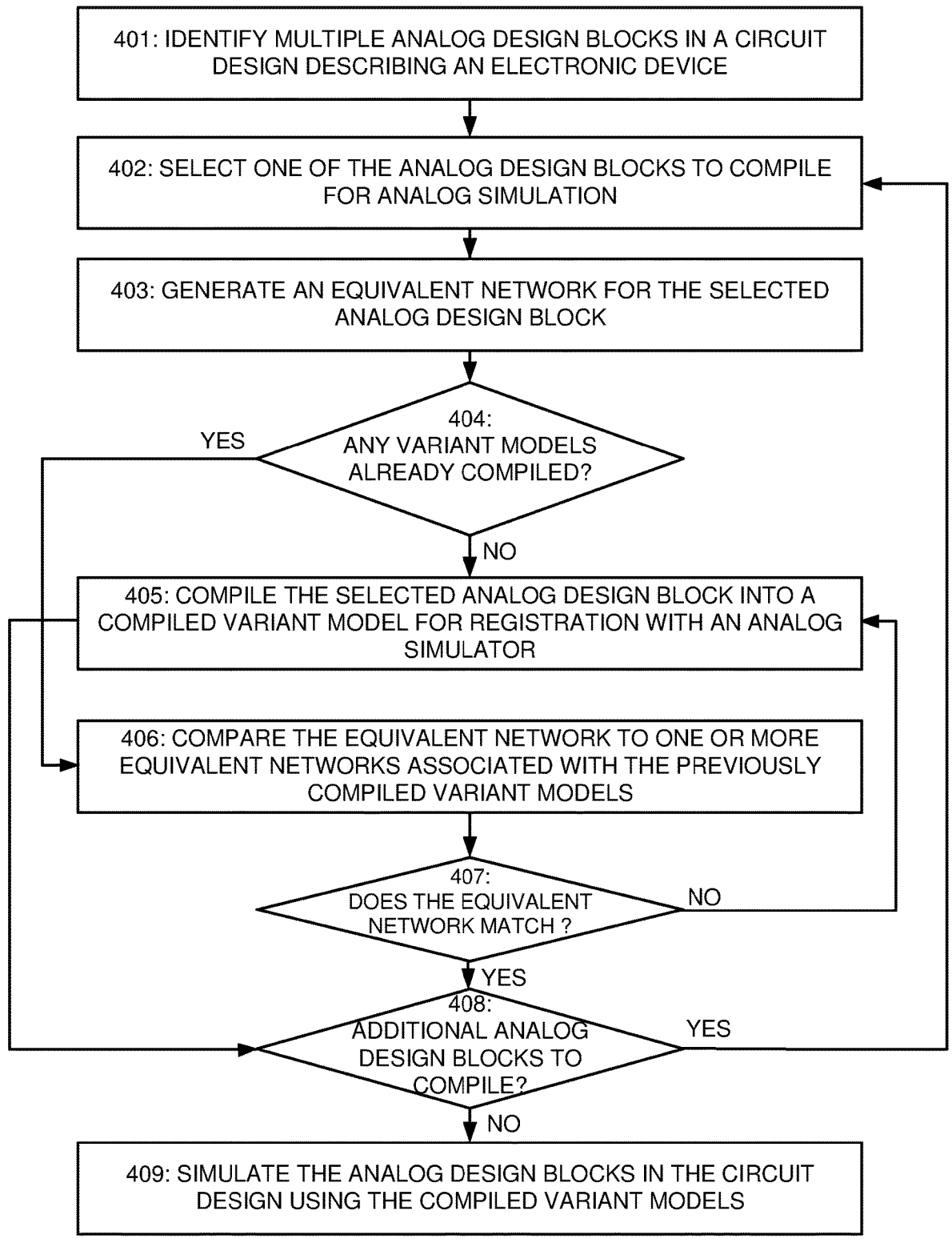
FIG. 4 illustrates a flowchart showing an example implementation of variant model-based compilation for analog simulation according to various examples.

FIG. 3 illustrates an example design verification system 300 for having a variant model-based compiler 310 for analog simulation that may be implemented according to various embodiments. FIG. 4 illustrates a flowchart showing an example implementation of variant model-based compilation for analog simulation according to various examples. Referring to FIGS. 3 and 4, the design verification system 300, for example, implemented in the computing device 101 of FIG. 1, can receive a circuit design 301 describing an electronic system including analog circuitry, which can describe the electronic system in terms of both the exchange of analog signals between circuit components and the operations that can be performed on those signals. The circuit design 301 can be written in one or more Hardware Design Languages (HDLs), such as Simulation Program with Integrated Circuit Emphasis (SPICE), Eldo-SPICE, Spectre, Verilog Analog (Verilog-A), Verilog Analog Mixed Signal (Verilog-AMS), VHDL-AMS, System-C, or the like.

The design verification system 300 can receive a test bench 302 capable of defining test stimulus, for example, clock signals, activation signals, power signals, control signals, data signals, or the like, that, when grouped, may form test bench transactions capable of prompting operation of the circuit design 301 in a verification environment, such as an analog simulation environment. In some embodiments, the test bench 302 can be written in an object-oriented programming language, for example, SystemVerilog or the like, that, when executed during elaboration, can dynamically generate test bench components for verification of the circuit design 301. A methodology library, for example, a Universal Verification Methodology (UVM) library, an Open Verification Methodology (OVM) library, an Advanced Verification Methodology (AVM) library, a Verification Methodology Manual (VMM) library, or the like, can be utilized as a base for creating the test bench 302.

The design verification tool 300 can include a variant model-based compiler 310 that, in a block 401 of FIG. 4, can identify multiple analog design blocks in the circuit design 301. The variant model-based compiler 310 can include a design parser 312 to traverse the circuit design 301 to identify the analog design blocks, for example, written in a Verilog-A hardware description language, and identify the parameters in the identified set of the analog design blocks, which can be utilized by the variant model-based compiler 310 to selectively compile a subset of the analog design blocks into multiple compiled variant models 311. By selectively compiling the analog design block based on their parameters, the variant model-based compiler 310 can generate a set of compiled variant models 311 that can be optimized for use during analog simulation. In some embodiments, the variant detection system 314 can generate an intermediate function that, when called by the variant detection system 314, can trigger or skip of variant compilation of the identified analog design blocks. The intermediate function can be configured to receive parameters of the analog design blocks and generate equivalent networks corresponding to behavioral topologies of the analog design blocks based on their parameters.

The variant model-based compiler 310 can include a variant detection system 314 to analyze the set of the analog design blocks detected by the design parser 312 to select the subset of the analog design blocks for an analog compiler 316 to compile into the compiled variant models 311. In some embodiments, the variant detection system 314 can initiate the analysis, in a block 402 of FIG. 4, by selecting one of the analog design blocks to compile for analog simulation. The selection of the analog design block can be based on a location of the analog design block in the hierarchy of the circuit design 301, an order of the parsing by the design parser 312, or the like.

The variant detection system 314, in decision block 403, can generate an equivalent network for the selected analog design block. In some embodiments, the variant detection system 314 can selectively collapse nodes and branches in the device model based on parameters of the selected analog design block. For example, by exploiting one or more rules associated with Verilog-A descriptions for contributions on nodes and branches, an overall behavior of the selected analog design block can be collapsed to a set of final contribution information or the equivalent network. In some embodiments, the exploitation of rules associated with Verilog-A descriptions for contributions on nodes and branches can include allowing subsequent contributions of a same type, such as voltage potential or current flow, to accumulate, allowing subsequent contributions of a same type, such as voltage potential or current flow, to overwrite, setting a branch to a voltage branch or current branch based on whether a current measurement exists on the branch, and setting a contribution value on a node or branch to zero when no voltage or current contribution exists.

In some embodiments, the variant detection system 314 can call the intermediate function for the common device model, which utilizes the parameters for the selected analog design block to generate the equivalent network for the selected analog block. The intermediate function can store the equivalent network in the variant model-based compiler 310 for subsequent comparison to other equivalent networks of the detected analog design blocks.

The variant detection system 314, in a decision block 404 of FIG. 4, can determine whether any variant models have already been compiled. In some embodiments, the variant model-based compiler 310 can store compiled variant models, which the variant detection system 314 can access to determine whether any variant models have already been compiled for the circuit design 301. When, in decision block 404, the variant detection system 314 determines that no variant models have already been compiled, execution can proceed to a block 405 of FIG. 4, where the analog compiler 316 can compile the selected analog design block into a compiled variant model 311 for registration with an analog simulator. In some embodiments, the intermediate function, when called, can determine whether any variant models have already been compiled and trigger the compilation of the selected analog design block.

When, in decision block 404, the variant detection system 314 determines that one or more variant models have already been compiled, execution can proceed to a block 406 of FIG. 4, where the variant detection system 314 can compare the equivalent network to one or more equivalent networks associated with previously selected analog design blocks. Since the equivalent networks for the detected analog blocks correspond to behavioral topologies of a device model having been optimized based on the specific parameters of the analog design blocks, the variant detection system 314 can compare the equivalent networks to determine whether, in a decision block 407, the equivalent network matches to any of the equivalent networks associated with previously selected analog design blocks. In some embodiments, the equivalent networks can be considered to match when they are identical to each other, behave the same, or include the same optimizations even though they had different sets of parameters. In some embodiments, the intermediate function, when called, can determine one or more variant models have already been compiled and compare the equivalent network to one or more equivalent networks associated with previously selected analog design blocks.

When, in decision block 407 of FIG. 4, the variant detection system 314 determines that the equivalent network does not match to any of the equivalent networks, execution can proceed to the block 405, where the analog compiler 316 can compile the selected analog design block into a compiled variant model before execution proceeds to a block 408 of FIG. 4. In some embodiments, the intermediate function can perform the comparison and determination of whether the equivalent networks match by accessing stored versions of the equivalent models generated by the variant detection system 314.

When, in decision block 407, the variant detection system 314 determines that the equivalent network matches to at least one of the equivalent networks, execution can proceed directly to the block 408, for example, skipping the compilation of the selected analog design block into a compiled variant model. By selectively compiling analog design blocks based on their equivalent networks, the variant model-based compiler 310 can control a number of variants compiled by the analog compiler 316 increasing compilation throughput, while also registering multiple compiled variants to allow the analog simulator to operate quickly by eliminating extraneous calculations and/or nodes in a matrix structure.

In a decision block 408, the variant detection system 314 can determine whether any additional analog design blocks identified in the block 401 remain for the variant model-based compiler 310 to compile. When, in decision block 408, the variant detection system 314 determines that one or more analog design blocks remain for the variant model-based compiler 310 to compile, execution can return to the block 402, where the variant detection system 314 selects another analog design block to compile.

When, in decision block 407, the variant detection system 314 determines no analog design blocks remain for the variant model-based compiler 310 to compile, execution can proceed to a block 409 of FIG. 4, where an analog simulator in a functional verification unit 320 can simulate the analog design blocks in the circuit design using the compiled variant models 311.

The design verification system 300 can include the functional verification unit 320 to implement a verification environment, which can simulate the circuit design 301 and the test bench 302 with an analog simulator. The analog simulator can simulate the functional operations performed by the circuit design 301 in response to the test stimulus generated by the test bench 302, for example, using a continuous time matrix-based differential equation solvers. The analog simulator can maps device terminals and connectivity into a matrix structure based, at least in part, on the compiled variant models 311, and iteratively determines sets of voltages and currents for all nodes and branches in the circuit design 301. In each iteration, the analog simulator can stamp the matrix with the current and voltage characteristics for each device in the analog circuit design. The functional verification unit 320 can generate verification results 303 including a set of voltages and currents for all nodes and branches in the circuit design 301 at each iteration, for example, generated by utilizing the current and voltage characteristics in the matrix to solve for Kirchoff's current law and Kirchoff's voltage law using Linear Algebra techniques. The design verification system 300 (or a tool external to the design verification tool 300) can perform a functional verification of the circuit design 301, for example, by comparing the verification results 303 with an expected output from the circuit design 301 in response the test stimulus generated by the test bench 302.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

Conclusion

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to design processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   identifying, by a computing system, multiple analog design blocks in a circuit design describing an electronic device, wherein the analog design blocks include different sets of parameters;
   generating, by the computing system, equivalent networks for the analog design blocks using the different sets of the parameters, which includes, for each of the analog design blocks, selectively collapsing nodes and branches in the analog design blocks based on values of the corresponding sets of the parameters;
   selectively compiling, by the computing system, a subset of the analog design blocks into multiple compiled variant models based, at least in part, on a comparison of the equivalent networks; and
   simulating, by the computing system implementing an analog simulator, the analog design blocks in the circuit design using the compiled variant models.

2. The method of claim 1, further comprising skipping, by the computing system, compilation of for one of the analog design blocks when a corresponding equivalent network is the same as at least one of the equivalent networks previously generated for at least one of the analog design blocks.

3. The method of claim 1, wherein the equivalent networks correspond to behavioral topologies of the analog design blocks having the different sets of the parameters.

4. The method of claim 1, further comprising generating, by the computing system, an intermediate function for the analog design blocks, wherein the intermediate function, when called, generates the equivalent networks for the analog design blocks using the different sets of the parameters.

5. The method of claim 4, wherein the intermediate function, when called by the computing system, compares the equivalent networks and selectively triggers compilation of the analog design blocks based, at least in part, on the comparison.

6. The method of claim 1, wherein the analog design blocks are written in a Verilog Analog (Verilog-A) hardware description language.

7. A system comprising:
a memory system configured to store computer-executable instructions; and
a computing system, in response to execution of the computer-executable instructions, is configured to:
identify multiple analog design blocks in a circuit design describing an electronic device, wherein the analog design blocks include different sets of parameters;
generate equivalent networks for the analog design blocks using the different sets of the parameters, which includes, for each of the analog design blocks, selectively collapsing nodes and branches in the analog design blocks based on values of the corresponding sets of the parameters;
selectively compile a subset of the analog design blocks into multiple compiled variant models based, at least in part, on a comparison of the equivalent networks; and
simulate, by an analog simulator, the analog design blocks in the circuit design using the compiled variant models.

8. The system of claim 7, wherein the computing system, in response to execution of the computer-executable instructions, is further configured to skip compilation of one of the analog design blocks when a corresponding equivalent network is the same as at least one of the equivalent networks previously generated for at least one of the analog design blocks.

9. The system of claim 7, wherein the equivalent networks correspond to behavioral topologies of the analog design blocks having the different sets of the parameters.

10. The system of claim 7, wherein the computing system, in response to execution of the computer-executable instructions, is further configured to generate an intermediate function for the analog design blocks, wherein the intermediate function, when called, generates the equivalent networks for the analog design blocks using the different sets of the parameters.

11. The system of claim 10, wherein the intermediate function, when called by the computing system, compares the equivalent networks and selectively triggers compilation of the analog design blocks based, at least in part, on the comparison.

12. An apparatus comprising at least one computer-readable memory device storing instructions configured to cause one or more processing devices in a computing system to perform operations comprising:
identifying multiple analog design blocks in a circuit design describing an electronic device, wherein the analog design blocks include different sets of parameters;
generating equivalent networks for the analog design blocks using the different sets of the parameters, which includes, for each of the analog design blocks, selectively collapsing nodes and branches in the analog design blocks based on values of the corresponding sets of the parameters;
selectively compiling a subset of the analog design blocks into multiple compiled variant models based, at least in part, on a comparison of the equivalent networks; and
simulating, by an analog simulator, the analog design blocks in the circuit design using the compiled variant models.

13. The apparatus of claim 12, wherein the instructions are configured to cause one or more processing devices to perform operations further comprising skipping compilation of one of the analog design blocks when a corresponding equivalent network is the same as at least one of the equivalent networks previously generated for at least one of the analog design blocks.

14. The apparatus of claim 12, wherein the equivalent networks correspond to behavioral topologies of the analog design blocks having the different sets of the parameters.

15. The apparatus of claim 12, wherein the instructions are configured to cause one or more processing devices to perform operations further comprising generating an intermediate function for analog design blocks, wherein the intermediate function, when called, generates the equivalent networks for the analog design blocks using the different sets of the parameters.

16. The apparatus of claim 15, wherein the intermediate function, when called by the computing system, compares the equivalent networks and selectively triggers compilation of the analog design blocks based, at least in part, on the comparison.

17. The apparatus of claim 12, wherein the analog design blocks are written in a Verilog Analog (Verilog-A) hardware description language.

* * * * *